United States Patent
Chiang

(10) Patent No.: US 6,963,226 B2
(45) Date of Patent: Nov. 8, 2005

(54) LOW-TO-HIGH LEVEL SHIFTER

(75) Inventor: Chia-Liang Chiang, Taipei Hsien (TW)

(73) Assignee: Realtek Semiconductor Corp., Hsin-Chu Hsien (TW)

( * ) Notice: Subject to any disclaimer, the term of this patent is extended or adjusted under 35 U.S.C. 154(b) by 19 days.

(21) Appl. No.: 10/708,295

(22) Filed: Feb. 23, 2004

(65) Prior Publication Data

US 2005/0017755 A1 Jan. 27, 2005

(30) Foreign Application Priority Data

Jul. 23, 2003 (TW) .............................. 92120142 A

(51) Int. Cl.[7] ........................................ H03K 19/0175
(52) U.S. Cl. ........................................ 326/68; 326/81
(58) Field of Search .................... 326/63–74, 80–83

(56) References Cited

U.S. PATENT DOCUMENTS

| | | | | |
|---|---|---|---|---|
| 5,821,800 A | * | 10/1998 | Le et al. ..................... 327/333 |
| 5,969,542 A | * | 10/1999 | Maley et al. .................. 326/81 |
| 6,002,290 A | * | 12/1999 | Avery et al. ................. 327/333 |
| 6,184,716 B1 | * | 2/2001 | Depetro et al. ............... 326/83 |
| 6,222,384 B1 | * | 4/2001 | Kim ............................ 326/68 |
| 6,404,229 B1 | * | 6/2002 | Barnes ......................... 326/68 |
| 6,487,687 B1 | * | 11/2002 | Blake et al. ................. 714/724 |
| 6,768,368 B2 | * | 7/2004 | Kaneko et al. ............. 327/333 |
| 6,801,064 B1 | * | 10/2004 | Hunt et al. .................. 327/112 |

* cited by examiner

Primary Examiner—Don Le
(74) Attorney, Agent, or Firm—Winston Hsu

(57) ABSTRACT

A low-to-high level shifter operating under a first supply voltage is disclosed. The low-to-high level shifter includes a pull-down circuit coupled to an input signal, the pull-down circuit having a plurality of low-voltage devices, the input signal corresponding to a second supply voltage; and a pull-up circuit coupled to the pull-down circuit, the pull-up circuit having a plurality of high-voltage devices. The low-to-high level shifter generates an output signal according to the input signal, the output signal corresponds to the first supply voltage, and the first supply voltage is larger than the second supply voltage.

22 Claims, 2 Drawing Sheets

LOW-TO-HIGH LEVEL SHIFTER

BACKGROUND OF INVENTION

1. Field of the Invention

The invention relates to a level shifter, and more particularly, to a level shifter for shifting the voltage level of a logic signal from a low operating voltage to a high operating voltage.

2. Description of the Prior Art

In an integrated circuit, because of the concerns of power and integration, the operating voltage of the integrated circuit is usually smaller than the operating voltage of an external system. Take an integrated circuit using 1.2V as the operating voltages to be an example, 1.2V and 0V are used to represent logic value 1 and 0 respectively. But an external circuit usually uses higher voltage as the operating voltage than the integrated circuit. For example, the operating voltage of circuit elements on a motherboard is normally 5V or 3.3V, that is, 5V or 3.3V is used to represent logic value 1, while 0V is used to represent logic value 0. Accordingly, in an integrated circuit, a device must be set for shifting the level of a logic signal switching between 1.2V and 0V into a logic signal switching between 5V(or 3.3V) and 0V, which is termed "low-to-high level shifter" hereinafter.

In an integrated circuit, a component operating at 5V/3.3V is called high-voltage element; a component operating at 1.2V is called low-voltage element. Take metal-oxide-semiconductor transistors (MOS transistor) for example, being a high-voltage element or a low-voltage element is determined by the thickness of the oxide-layer of the MOS transistor. Generally speaking, a high-voltage MOS transistor has a thicker oxide-layer than a low-voltage MOS transistor. Consequently, the threshold voltage of the high-voltage MOS transistor is higher than the threshold voltage of the low-voltage MOS transistor. Normally a high-voltage MOS transistor has a nominal threshold voltage of 0.9V.

Please refer to FIG. 1, a circuit diagram of a conventional low-to-high level shifter is illustrated. The low-to-high level shifter 100 includes: a high-voltage NMOS transistor 120, a high-voltage NMOS transistor 140, a high-voltage PMOS transistor 160 and a high-voltage PMOS transistor 180. When the four transistors are turned on or off, a first output end 191 and a second output end 192 will be charged or discharged, and the goal of level shifting will be achieved as a result.

Assume that in FIG. 1, VDDH=3.3V, VSSH=0V, VDDL=1.2V, VSSL=0V. When the potential of a first input signal SL1 changes from VSSL to VDDL, at first the high-voltage NMOS transistor 120 will be turned on, while the high-voltage NMOS transistor 140 will be turned off, the potential of a first output signal SH1 on the first output end 191 will become VSSH. Next, because the potential of the first output signal SH1 equals VSSH, the high-voltage PMOS transistor 180 will be turned on, in turn the potential of the second output signal SH2 on the second output end 192 will become VDDH.

But with advanced technology on integrated circuit processes, the operating voltage of the integrated circuit becomes smaller and smaller. For example, an integrated circuit produced through advanced technology can have an operating voltage lower than 1.2, such as 0.9V or even lower. Under such circumstances the low-to-high level shifter 100 in FIG. 1 will probably pass logic signals wrongly.

Now consider the situation when VDDL equals 1V (assume that other parameters are unchanged). When the potential of the first input signal SL1 changes from VSSL to VDDL, because VDDL is only a bit higher than the threshold voltage of the high-voltage NMOS transistor 120, the falling speed of the potential of the first output signal SH1 will be slow, in turn the raising speed of the potential of the second output signal SH2 will also be slow. The consequence is that the switching time for the integrated circuit becomes longer, the jitter problem of logic signals becomes more serious, and as a result the whole circuit becomes unreliable. If the operating frequency of the first input signal SL1 rises, the potential of the first output signal SH1 may not have enough time to switch correctly. An extreme case is that when VDDL equals 0.9V or is lower than 0.9V, when the potential at the gate of the high-voltage NMOS transistor 120 or the high-voltage NMOS transistor 140 equals VDDL, the two transistors may not be turned on, and the low-to-high level shifter can not function correctly at all.

As depicted above, one problem the prior art low-to-high level shifter faces is that logic signals probably can not pass through the low-to-high level shifter correctly, when the operating voltage of the integrated circuit becomes smaller and smaller

SUMMARY OF INVENTION

It is therefore one of the many objectives of the claimed invention to provide a low-to-high level shifter using low-voltage elements as pull-down elements and including a clamping circuit.

According to embodiments of the invention, a low-to-high level shifter operating under a first supply voltage is disclosed. The low-to-high level shifter comprises a pull-down circuit coupled to an input signal, the input signal corresponding to a second supply voltage; a pull-up circuit coupled to the pull-down circuit; and a clamping circuit coupled to the pull-down circuit, for clamping an operating voltage of the pull-down circuit. The low-to-high level shifter generates an output signal according to the input signal, the output signal corresponds to the first supply voltage, and the first supply voltage is larger than the second supply voltage.

According to embodiments of the invention, a low-to-high level shifter operating under a first supply voltage is disclosed. The low-to-high level shifter comprises a pull-down circuit coupled to an input signal, the pull-down circuit comprising a plurality of low-voltage devices, the input signal corresponding to a second supply voltage; and a pull-up circuit coupled to the pull-down circuit, the pull-up circuit comprising a plurality of high-voltage devices. The low-to-high level shifter generates an output signal according to the input signal, the output signal corresponds to the first supply voltage, and the first supply voltage is larger than the second supply voltage.

These and other objectives of the present invention will no doubt become obvious to those of ordinary skill in the art after reading the following detailed description of the embodiment that is illustrated in the various figures and drawings.

DETAILED DESCRIPTION

Figure 2:
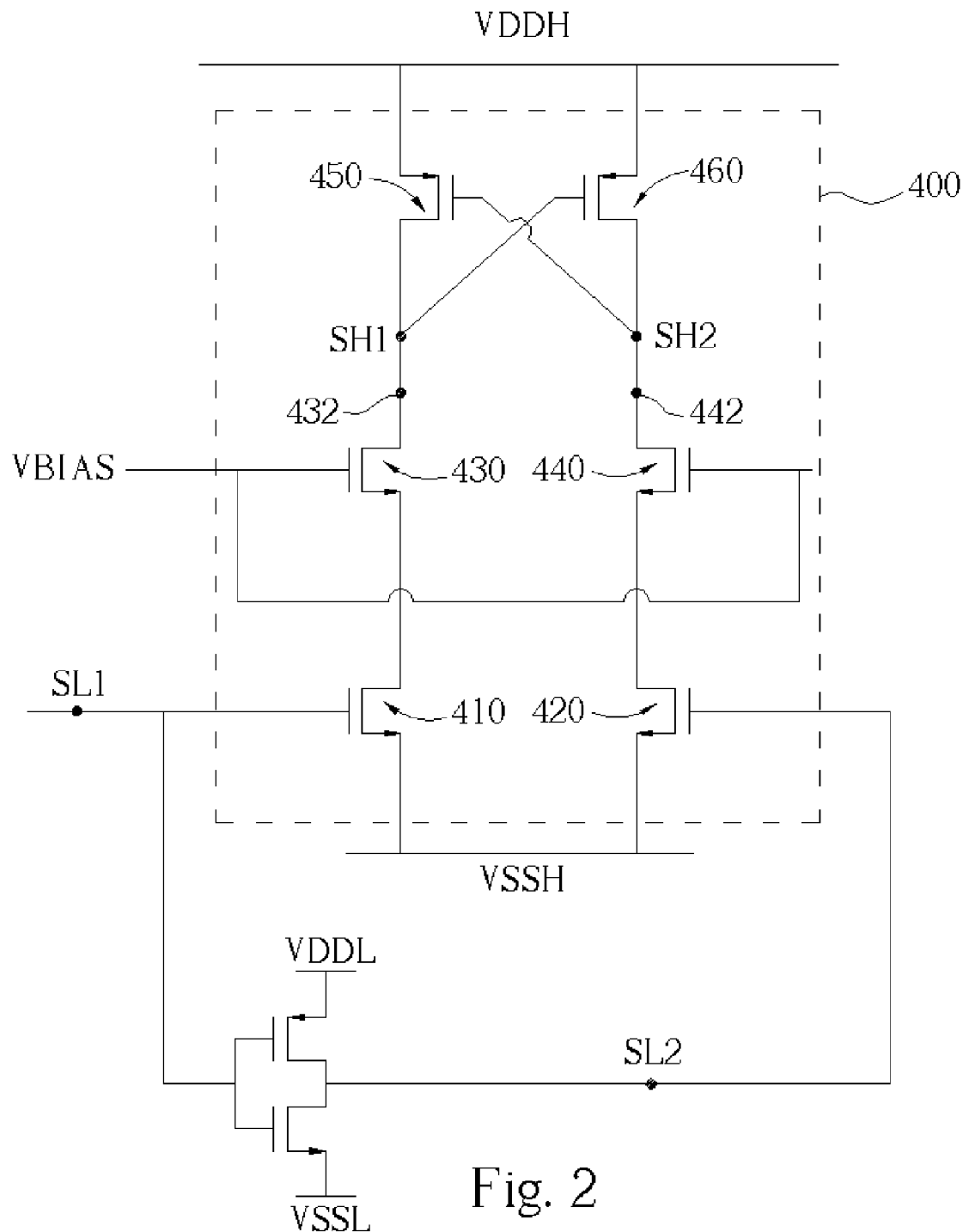
FIG. 2 is a circuit diagram of a low-to-high level shifter according to an embodiment of the present invention.

Please refer to FIG. 2, a circuit diagram of a low-to-high level shifter according to an embodiment of the present invention is illustrated. A low-to-high level shifter 400 includes a pull-down circuit, a pull-up circuit, and a clamping circuit. In this embodiment, the pull-down circuit includes a first pull-down unit, that is a low-voltage NMOS transistor 410; and a second pull-down unit, that is a low-voltage NMOS transistor 420. The pull-up circuit includes a first pull-up unit, that is a high-voltage PMOS transistor 450; and a second pull-up unit, that is a high-voltage PMOS transistor 460. The clamping circuit includes a first clamping unit, that is a high-voltage NMOS transistor 430; and a second clamping unit, that is a high-voltage NMOS transistor 440. Please note that herein MOS transistors are divided into high-voltage MOS transistors and low-voltage MOS transistors, where they have different thickness on their oxide-layer, they can operate at different voltage range, and they have different threshold voltage.

Figure 1:
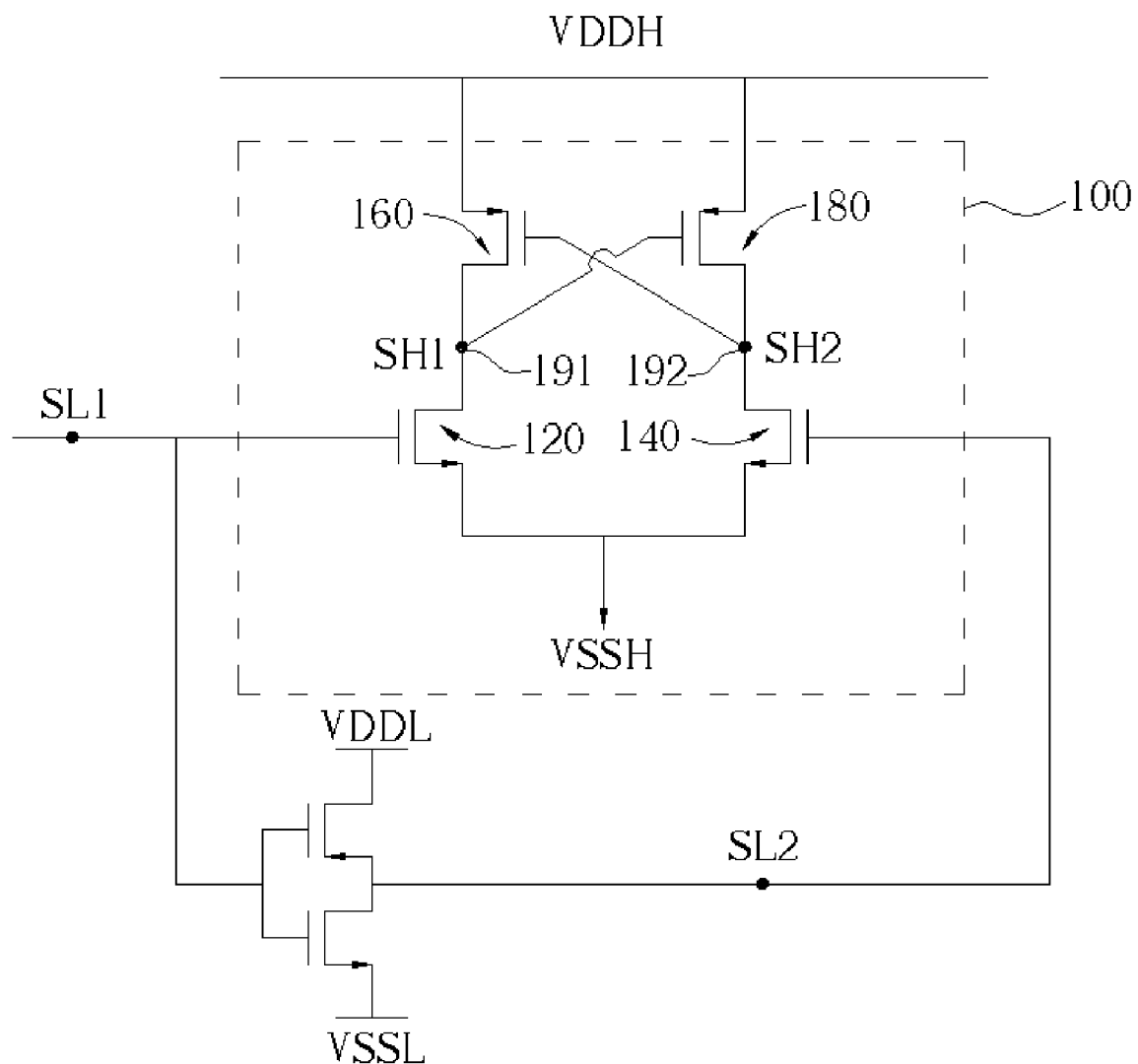
FIG. 1 is a circuit diagram of a conventional low-to-high level shifter.

In FIG. 1 the low-to-high level shifter 100 uses high-voltage elements (that is, the high-voltage NMOS transistor 120 and the high-voltage NMOS transistor 140) as pull-down elements, while in this embodiment, low-voltage elements (that is, the low-voltage NMOS transistor 410 and the low-voltage NMOS transistor 420) are used. Because low-voltage elements have lower threshold voltage than high-voltage elements (for example, the threshold voltages of high-voltage elements and low-voltage elements are 0.9V and 0.5V respectively), when VDDL is used as the gate voltage of the low-voltage NMOS transistor 410 or the low-voltage NMOS transistor 420, the channel between the drain and source of the transistor can be turned on correctly, then the potential at its drain can be discharged to VSSH very fast. It should be noted that being low voltage elements, the potential at the drain of the low-voltage NMOS transistor 410 or the low-voltage NMOS transistor 420 should not be of too high a value (such as VDDH), or the element will probably be damaged. So in this embodiment, two clamping units are used to guarantee the potential at the drain of the low-voltage NMOS transistor 410 or the low-voltage NMOS transistor 420 will not be too high to damage these low-voltage elements.

The gate of the high-voltage NMOS transistor 430 couples to a bias voltage VBIAS, for making sure that the potential at the drain of the low-voltage NMOS transistor 410 will not exceed VBIAS subtracting the threshold voltage Vt of the high-voltage transistor 430. So if the maximum potential the low-voltage NMOS transistor 410 can tolerate at its drain is 1.5V, a simple design choice is to use 2.4V as VBIAS (at this time VBIAS−Vt=1.5V). The function of the high-voltage NMOS transistor 440 is similar to that of the high-voltage NMOS transistor 430.

The gate of the high-voltage PMOS transistor 450 couples to a second output end 442, the drain couples to a first output end 432, and the source couples to a high-voltage bias having potential equals VDDH. The function of the high-voltage PMOS transistor 450 is to pull up the potential of the first output signal SH1 at the first output end 432 to become VDDH when the potential of the second output signal SH2 at the second output end 442 substantially equals VSSH. The function of the high-voltage PMOS transistor 460 is similar to that of the high-voltage PMOS transistor 450.

Please note that although in this embodiment the gates of the high-voltage NMOS transistor 430 and the high-voltage NMOS transistor 440 use only one bias voltage VBIAS, in other embodiments these two transistors can use different bias voltages with different potentials. The way to generate the bias voltage is a design choice of the circuit designer.

The low-to-high level shifter according to embodiments of the present invention uses low-voltage elements as pull-down elements, while uses clamping elements to protect the low-voltage elements. As a result, the low-to-high level shifter according to embodiments of the present invention can pass logical signals correctly even with the operating voltage of the integrated circuit becoming smaller and smaller.

Those skilled in the art will readily observe that numerous modification and alternation of the device may be made while retaining the teaching of the invention. Accordingly, the above disclosure should be construed as limited only by the metes and bounds of the appended claims.

What is claimed is:

1. A low-to-high level shifter operating under a first supply voltage, the low-to-high level shifter comprising:
   a pull-down circuit coupled to an input signal, the input signal corresponding to a second supply voltage;
   a pull-up circuit coupled to the pull-down circuit; and
   a clamping circuit coupled to the pull-down circuit, for clamping an operating voltage of the pull-down circuit;
   wherein the low-to-high level shifter generates an output signal according to the input signal, the output signal corresponds to the first supply voltage, and the first supply is larger than the second supply voltage;
   wherein the pull-down circuit comprises a plurality of low-voltage devices, and the pull-up circuit comprises a plurality of high-voltage devices.

2. The low-to-high level shifter of claim 1 wherein the low-voltage devices have a lower turn-on characteristic than the high-voltage devices.

3. The low-to-high level shifter of claim 1 wherein the pull-down circuit comprises a first pull-down transistor and a second pull-down transistor, control terminals of the first and the second pull-down transistors are coupled to the input signal.

4. The low-to-high level shifter of claim 1 wherein the pull-up circuit comprises a first pull-up transistor and a second pull-up transistor, a control terminal of the first pull-up transistor is coupled to a first terminal of the second pull-up transistor, and a control terminal of the second pull-up transistor is coupled to a first terminal of the first pull-up transistor.

5. The low-to-high level shifter of claim 4 wherein the output signal is extracted from the first terminal of the first pull-up transistor.

6. The low-to-high level shifter of claim 4 wherein the first terminals of the first and the second pull-up transistors are coupled to the pull-down circuit.

7. The low-to-high level shifter of claim 1 wherein the clamping circuit comprises a first clamping transistor and a second clamping transistor, control terminals of the first and the second clamping transistors are coupled to a bias voltage.

8. The low-to-high level shifter of claim 1 wherein the input signal is coupled to the pull-down circuit via an inverter operating under the second supply voltage.

9. A low-to-high level shifter operating under a first supply voltage, the low-to-high level shifter comprising:
   a pull-down circuit coupled to an input signal, the pull-down circuit comprising a plurality of low-voltage devices, the input signal corresponding to a second supply voltage; and a pull-up circuit coupled to the pull-down circuit, the pull-up circuit comprising a plurality of high-voltage devices;

wherein the low-to-high level shifter generates an output signal according to the input signal, the output signal corresponds to the first supply voltage, and the first supply voltage is larger than the second supply voltage.

10. The low-to-high level shifter of claim 9 further comprising:

a clamping circuit coupled to the pull-down circuit, for clamping an operating voltage of the pull-down circuit.

11. The low-to-high level shifter of claim 10 wherein the clamping circuit comprises a first clamping transistor and a second clamping transistor, control terminals of the first and the second clamping transistors are coupled to a bias voltage.

12. The low-to-high level shifter of claim 9 wherein the pull-down circuit comprises a first pull-down transistor and a second pull-down transistor, control terminals of the first and the second pull-down transistors are coupled to the input signal.

13. The low-to-high level shifter of claim 9 wherein the pull-up circuit comprises a first pull-up transistor and a second pull-up transistor, a control terminal of the first pull-up transistor is coupled to a first terminal of the second pull-up transistor, and a control terminal of the second pull-up transistor is coupled to a first terminal of the first pull-up transistor.

14. The low-to-high level shifter of claim 13 wherein the output signal is extracted from the first terminal of the first pull-up transistor.

15. The low-to-high level shifter of claim 13 wherein the first terminals of the first and the second pull-up transistors are coupled to the pull-down circuit.

16. The low-to-high level shifter of claim 9 wherein the input signal is coupled to the pull-down circuit via an inverter operating under the second supply voltage.

17. The low-to-high level shifter of claim 9 wherein the low-voltage devices have a lower turn-on characteristic than the high-voltage devices.

18. A low-to-high level shifter operating under a first supply voltage, the low-to-high level shifter comprising:

a pull-down circuit coupled to an input signal, the pull-down circuit comprising a plurality of first-voltage devices, the input signal corresponding to a second supply voltage; and a pull-up circuit coupled to the pull-down circuit, the pull-up circuit comprising a plurality of second-voltage devices;

wherein the low-to-high level shifter generates an output signal according to the input signal, the output signal corresponds to the first supply voltage, and the first supply voltage is larger than the second supply voltage;

wherein the first-voltage devices and the second-voltage devices have different threshold voltages.

19. The low-to-high level shifter of claim 18 further comprising:

a clamping circuit coupled to the pull-down circuit, for clamping an operating voltage of the pull-down circuit.

20. The low-to-high level shifter of claim 19 wherein the clamping circuit comprises a first clamping transistor and a second clamping transistor, control terminals of the first and the second clamping transistors are coupled to a bias voltage.

21. The low-to-high level shifter of claim 18 wherein the first-voltage devices comprise a first pull-down transistor and a second pull-down transistor, control terminals of the first and the second pull-down transistors are coupled to the input signal.

22. The low-to-high level shifter of claim 18 wherein the second-voltage devices comprise a first pull-up transistor and a second pull-up transistor, a control terminal of the first pull-up transistor is coupled to a first terminal of the second pull-up transistor, and a control terminal of the second pull-up transistor is coupled to a first terminal of the first pull-up transistor.

* * * * *